(12) United States Patent
Abe et al.

(10) Patent No.: US 11,394,176 B2
(45) Date of Patent: Jul. 19, 2022

(54) LIGHT EMITTING DEVICE

(71) Applicant: Panasonic Intellectual Property Management Co., Ltd., Osaka (JP)

(72) Inventors: Takeshi Abe, Osaka (JP); Shozo Oshio, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 351 days.

(21) Appl. No.: 16/630,395

(22) PCT Filed: Jun. 20, 2018

(86) PCT No.: PCT/JP2018/023387
§ 371 (c)(1),
(2) Date: Jan. 10, 2020

(87) PCT Pub. No.: WO2019/021699
PCT Pub. Date: Jan. 31, 2019

(65) Prior Publication Data
US 2021/0091539 A1 Mar. 25, 2021

(30) Foreign Application Priority Data
Jul. 24, 2017 (JP) .............................. JP2017-142539

(51) Int. Cl.
*H01S 5/323* (2006.01)
*F21K 9/64* (2016.01)
*H01S 5/06* (2006.01)

(52) U.S. Cl.
CPC ............ *H01S 5/32341* (2013.01); *F21K 9/64* (2016.08); *H01S 5/0611* (2013.01)

(58) Field of Classification Search
CPC .... H01S 5/32341; H01S 5/0611; H01S 5/022; F21K 9/64; C09K 11/7774; F21V 9/38; G02B 5/20; H01L 33/50
See application file for complete search history.

(56) References Cited

U.S. PATENT DOCUMENTS 7,442,326 B2   10/2008   Setlur
10,364,963 B2   7/2019   Oshio
(Continued)

FOREIGN PATENT DOCUMENTS

CN   1789795 A   6/2006
JP   2005-008844 A   1/2005
(Continued)

OTHER PUBLICATIONS

A. Kalaji et al., "Ce3+-Activated γ-Ca2SiO4 and Other Olivine-Type ABXO4 Phosphors for Solid-State Lighting", Chemistry of Materials 2014 26 (13), 3966-3975. (Year: 2014).*
(Continued)

*Primary Examiner* — Xinning(Tom) Niu
(74) *Attorney, Agent, or Firm* — Renner, Otto, Boisselle & Sklar, LLP

(57) ABSTRACT

A light emitting device includes: a solid-state light emitting element that radiates blue-series laser light; and a wavelength converter 100 that absorbs the laser light and performs wavelength conversion of the absorbed laser light into light with a longer wavelength than a wavelength of the laser light. The wavelength converter includes: a silicate phosphor 1 containing $Lu_2CaMg_2(SiO_4)_3:Ce^{3+}$ as a main component; and an aluminate phosphor 2 containing $Lu_3(Al_{1-x}Ga_x)_2(AlO_4)_3:Ce^{3+}$ (where x is a numeric value that satisfies $0<x\le1$) as a main component.

14 Claims, 5 Drawing Sheets

(56) References Cited

U.S. PATENT DOCUMENTS

| | | |
|---|---|---|
| 2006/0284196 A1 | 12/2006 | Setlur |
| 2010/0148203 A1* | 6/2010 | Hashimoto ............ H01S 5/0087 |
| | | 257/E33.061 |
| 2011/0227476 A1* | 9/2011 | Zhang ................. C09K 11/7774 |
| | | 313/503 |
| 2011/0227477 A1 | 9/2011 | Zhang |
| 2013/0313967 A1 | 11/2013 | Zhang |
| 2015/0357531 A1 | 12/2015 | Moon |
| 2017/0343188 A1 | 11/2017 | Oshio |

FOREIGN PATENT DOCUMENTS

| | | |
|---|---|---|
| JP | 2013-526007 A | 6/2013 |
| JP | 2017-011098 A | 1/2017 |
| KR | 10-2017-0125218 A | 11/2017 |
| WO | 2007/062136 A1 | 5/2007 |
| WO | 2016/092743 A1 | 6/2016 |
| WO | 2016/173691 A1 | 11/2016 |
| WO | 2018/108988 A1 | 6/2018 |

OTHER PUBLICATIONS

International Search Report for corresponding Application No. PCT/JP2018/023387, dated Sep. 18, 2018.

Written Opinion for corresponding Application No. PCT/JP2018/023387, dated Sep. 18, 2018.

Seilur, Anant A. et al., "Crystal Chemistry and Luminescence of $Ce^{3+}$-Doped $Lu_2CaMg_2$ (Si, Ge) $3O_{12}$ and its Use in LED Based Lighting", Chem. Mater., Jul. 6, 2006, vol. 18, No. 14, pp. 3314-3322.

\* cited by examiner

LIGHT EMITTING DEVICE

TECHNICAL FIELD

The present invention relates to a light emitting device. In detail, the present invention relates to a light emitting device that can be suitably used for general illumination and special illumination, and further, is capable of radiating high color-rendering output light in which a color tone change of white light is hard for human eyes to see, the color change following a temperature rise of a wavelength converter.

BACKGROUND ART

Heretofore, there has been known a light emitting device composed by combining a solid-state light emitting element that radiates laser light and a wavelength converter including a plurality of types of $Ce^{3+}$-activated phosphors with each other (refer to Patent Literature 1). Patent Literature 1 discloses a light emitting device with high color rendering properties, in which a solid-state light emitting element that radiates blue laser light and a wavelength converter are combined with each other, the wavelength converter including a $Lu_3Al_2(AlO_4)_3:Ce^{3+}$ green phosphor and a $Y_3Mg_2(AlO_4)(SiO_4)_2:Ce^{3+}$ red phosphor. Such a light emitting device as described above can exert a high output since light emission of the phosphor is hard to saturate even under high-density photoexcitation. Note that such light emission saturation refers to a phenomenon that an intensity of light radiated by a phosphor is saturated as an excitation light density increases.

Meanwhile, apart from the above-mentioned $Y_3Mg_2(AlO_4)(SiO_4)_2:Ce^{3+}$ red phosphor, $Lu_2CaMg_2(SiO_4)_3:Ce^{3+}$ orange phosphor is also known as a $Ce^{3+}$-activated phosphor that radiates red-series light (refer to Patent Literature 2).

CITATION LIST

Patent Literature

Patent Literature 1: International Publication No. WO 2016/092743
Patent Literature 2: International Publication No. WO 2007/062136

SUMMARY OF INVENTION

However, temperature quenching of the $Y_3Mg_2(AlO_4)(SiO_4)_2:Ce^{3+}$ red phosphor is large, and further study is required for practical use of the $Y_3Mg_2(AlO_4)(SiO_4)_2:Ce^{3+}$ red phosphor. Note that the temperature quenching refers to a phenomenon that light emission efficiency decreases as a temperature of a phosphor rises.

Meanwhile, in the $Lu_2CaMg_2(SiO_4)_3:Ce^{3+}$ orange phosphor, temperature quenching thereof is relatively small; however, an amount of a red component included in light radiated therefrom is small. Therefore, output light of the light emitting device in which the solid-state light emitting element that radiates blue laser light and the wavelength converter are combined with each other, the wavelength converter including the $Lu_3Al_2(AlO_4)_3:Ce^{3+}$ green phosphor and the $Lu_2CaMg_2(SiO_4)_3:Ce^{3+}$ orange phosphor, has had a problem of low color rendering properties. Moreover, the output light of such a light emitting device has had a problem that a color tone change, which follows the temperature rise of the wavelength converter, is easy for human eyes to see, and is easily sensed.

The present invention has been made in consideration of such problems as described above, which are inherent in the prior art. Then, it is an object of the present invention to provide a light emitting device in which a color tone change of white light at a time of temperature rise is hard for human eyes to see, the light emitting device being capable of radiating high color-rendering output light.

In order to solve the above-described problems, a light emitting device according to an aspect of the present invention includes: a solid-state light emitting element that radiates blue-series laser light; and a wavelength converter that absorbs the laser light and performs wavelength conversion of the absorbed laser light into light with a longer wavelength than that of the laser light. The wavelength converter includes: a silicate phosphor containing $Lu_2CaMg_2(SiO_4)_3:Ce^{3+}$ as a main component; and an aluminate phosphor containing $Lu_3(Al_{1-x}Ga_x)_2(AlO_4)_3:Ce^{3+}$ (where x is a numeric value that satisfies $0<x \le 1$) as a main component.

DESCRIPTION OF EMBODIMENTS

Figure 1:
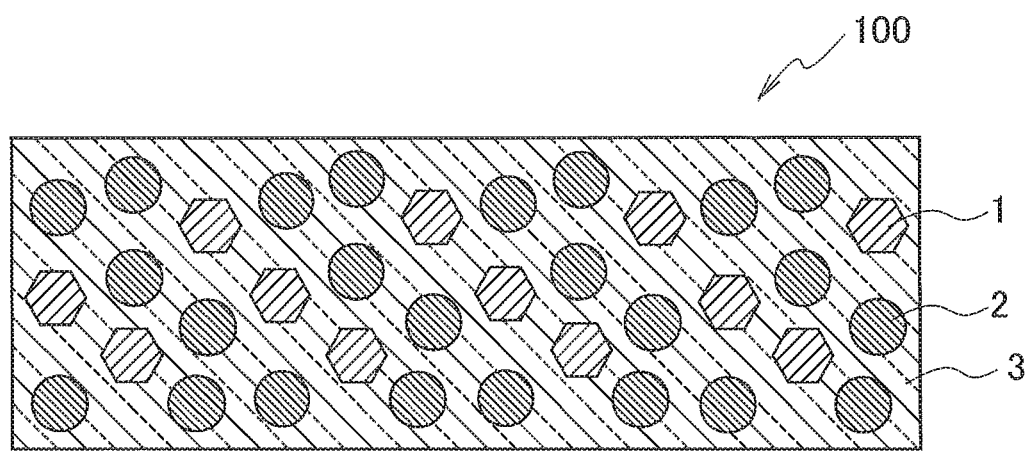
FIG. 1 is a schematic cross-sectional view illustrating an example of a wavelength converter according to an embodiment of the present invention.

Hereinafter, a detailed description will be given of a light emitting device according to this embodiment. Note that dimensional ratios in the drawings are exaggerated for convenience of explanation, and are sometimes different from actual ratios.

The light emitting device of this embodiment includes: a solid-state light emitting element that radiates blue-series laser light; and a wavelength converter that absorbs the laser light and performs wavelength conversion of the absorbed laser light into light with a longer wavelength than that of the laser light. In the light emitting device, the wavelength converter has functions to absorb light energy emitted by the solid-state light emitting element, and to convert the absorbed light energy into visible light of which color tone is controlled. Such a wavelength converter as described above is used for the light emitting device using the solid-state light emitting element, whereby it becomes possible to control the color tone of the light emitted by the solid-state light emitting element, and to obtain desired light.

[Solid-State Light Emitting Element]

In this embodiment, the solid-state light emitting element is preferably a light emitting element that radiates blue light, more preferably a light emitting element that radiates blue-series laser light. Such a solid-state light emitting element is not particularly limited; however, for example, a laser diode such as a surface-emitting laser diode can be used. Moreover, as the solid-state light emitting element, an inorganic or organic electroluminescence element can also be used.

It is preferable that the laser light emitted by the solid-state light emitting element have a maximum intensity value within a wavelength range of 420 nm or more and less than 480 nm, preferably 440 nm or more and less than 470 nm. This makes it possible to efficiently excite a phosphor included in the wavelength converter. Moreover, if the laser light has the maximum intensity value within the above-described wavelength range, then the laser light becomes blue light with good visibility and is usable not only as excitation light for phosphors but also as output light of the light emitting device without waste.

[Wavelength Converter]

In this embodiment, the wavelength converter contains a plurality of types of phosphors. Specifically, the wavelength converter includes at least a silicate phosphor and an aluminate phosphor.

The silicate phosphor included in the wavelength converter contains $Lu_2CaMg_2(SiO_4)_3:Ce^{3+}$ as a main component. This silicate phosphor includes: silicate with a garnet structure, which contains, as a main component, a compound represented by a general formula: $Lu_2CaMg_2(SiO_4)_3$; and $Ce^{3+}$ as ions which function as a light emission center. Such silicate as described above has good crystallinity, and accordingly, is excellent in monodispersity, thus making it possible to obtain a phosphor that combines high light emission efficiency and high light absorption rate with each other.

The above-mentioned "silicate with a garnet structure, which contains, as a main component, a compound represented by a general formula: $Lu_2CaMg_2(SiO_4)_3$," refers to silicate that consists of $Lu_2CaMg_2(SiO_4)_3$ and has a garnet-type crystal structure. Alternatively, "silicate with a garnet structure, which contains, as a main component, silicate represented by a general formula: $Lu_2CaMg_2(SiO_4)_3$" refers to silicate that has a garnet-type crystal structure and is a solid solution in which a solid solution ratio of $Lu_2CaMg_2(SiO_4)_3$ silicate serving as an end member is 70 mol % or more. Note that, in the silicate, more preferably, the solid solution ratio of the $Lu_2CaMg_2(SiO_4)_3$ silicate serving as an end member is 90 mol % or more.

When the silicate is the solid solution containing $Lu_2CaMg_2(SiO_4)_3$, a compound to be solid-solved with $Lu_2CaMg_2(SiO_4)_3$ is not particularly limited. The compound to be thus solid-solved also includes, for example, a virtual compound such as $Lu_2MgMg_2(SiO_4)_3$, which is estimated to actually exist as a compound. A reason for this is that a large number of examples of solid solutions each having a mode with which a compound estimated to actually exist is to be solid-solved are present as well-known to those skilled in the art.

As specific examples of the silicate as the solid solution, there are mentioned $(1-x)Lu_2CaMg_2(SiO_4)_3-xLu_3Al_2(AlO_4)_3$, $(1-x)Lu_2CaMg_2(SiO_4)_3-xLu_3Mg_2(SiO_4)_2(AlO_4)$, $(1-x)Lu_2CaMg_2(SiO_4)_3-xCa_3Sc_2(SiO_4)_3$, $(1-x)Lu_2CaMg_2(SiO_4)_3-xLu_2MgMg_2(SiO_4)_3$ and the like. Herein, x is preferably a numeric value that satisfies $0 \le x<0.3$, more preferably a numeric value that satisfies $0 \le x<0.1$.

As mentioned above, the silicate phosphor includes: silicate containing $Lu_2CaMg_2(SiO_4)_3$ as a main component; and $Ce^{3+}$ that functions as a light emission center. Such a silicate phosphor as described above can absorb blue light around a wavelength of 460 nm, and can perform wavelength conversion of the absorbed blue light into orange light having a fluorescence peak around a wavelength of 600 nm.

It is preferable that the silicate phosphor be a phosphor that emits light having a fluorescence peak within a wavelength range of 580 nm or more and less than 630 rm. Specifically, when a peak wavelength of excitation light is 455 nm, it is more preferable that the silicate phosphor be a phosphor that emits, at room temperature, light having a fluorescence peak within the wavelength range of 580 nm or more and less than 630 nm. The light emitted by the phosphor has the fluorescence peak within this wavelength range, whereby it becomes possible obtain white light with high color rendering properties by combining the solid-state light emitting element that emits blue-series laser light and the aluminate phosphor to be described later with each other. Moreover, a spectral distribution of the output light from the light emitting device becomes close to the spectral distribution of natural light, and accordingly, it becomes possible to obtain a light emitting device capable of radiating higher color-rendering white light.

The aluminate phosphor included in the wavelength converter contains $Lu_3(Al_{1-x}Ga_x)_2(AlO_4)_3:Ce^{3+}$ as a main component. Note that, in the formula, x is a numeric value that satisfies $0<x \le 1$. This aluminate phosphor includes: aluminate with a garnet structure, which contains, as a main component, a compound represented by a general formula: $Lu_3(Al_{1-x}Ga_x)_2(AlO_4)_3$; and $Ce^{3+}$ as ions which function as a light emission center. Such aluminate as described above has good crystallinity like the above-mentioned silicate, and accordingly, is excellent in monodispersity, thus making it possible to obtain the phosphor that combines high light emission efficiency and high light absorption rate with each other.

The above-mentioned "aluminate containing, as a main component, a compound represented by a general formula: $Lu_3(Al_{1-x}Ga_x)_2(AlO_4)_3$" refers to aluminate consisting of $Lu_3(Al_{1-x}Ga_x)_2(AlO_4)_3$. Alternatively, "aluminate containing, as a main component, a compound represented by a general formula: $Lu_3(Al_{1-x}Ga_x)_2(AlO_4)_3$" refers to aluminate as a solid solution in which a solid solution ratio of $Lu_3(Al_{1-x}Ga_x)_2(AlO_4)_3$ serving as an end member is 70 mol % or more. Then, the aluminate has a garnet-type crystal structure. Note that, in the aluminate, more preferably, the solid solution ratio of the $Lu_3(Al_{1-x}Ga_x)_2(AlO_4)_3$ serving as an end member is 90 mol % or more.

Note that, like the above-mentioned silicate, when the aluminate is the solid solution containing $Lu_3(Al_{1-x}Ga_x)_2(AlO_4)_3$, a compound to be solid-solved with $Lu_3(Al_{1-x}Ga_x)_2(AlO_4)_3$ is not particularly limited.

As mentioned above, the aluminate phosphor includes: the aluminate containing $Lu_3(Al_{1-x}Ga_x)_2(AlO_4)_3$ as a main component; and $Ce^{3+}$ that functions as a light emission center. Like $Lu_3Al_2(AlO_4)_3:Ce^{3+}$ described in Patent Literature 1, the aluminate phosphor can absorb blue light around a wavelength of 460 nm, and can perform wavelength conversion of the absorbed blue light into blue-green to green light having a fluorescence peak within a wavelength range of 490 nm or more to less than 560 m.

The aluminate phosphor is preferably a phosphor that emits light having a fluorescence peak within the wavelength range of 490 nm or more and less than 560 nm. Moreover, the aluminate phosphor is more preferably a phosphor that emits light having a fluorescence peak within a wavelength range of 490 nm or more and less than 530 nm, particularly preferably a phosphor that emits light having a fluorescence peak within a wavelength range of 490 nm or more and less than 515 nm. Specifically, when a peak wavelength of excitation light is 455 nm, the aluminate phosphor is preferably a phosphor that emits, at room temperature, light having a fluorescence peak within the wavelength range of 490 nm or more and less than 560 nm. Moreover, when the peak wavelength of the excitation light is 455 nm, it is more preferable that the aluminate phosphor be a phosphor that emits, at room temperature, light having a fluorescence peak within the wavelength range of 490 nm or more and less than 530 nm, and particularly, within a wavelength range of 490 nm or more and less than 515 nm. The light emitted by the phosphor has the fluorescence peak within this wavelength range, whereby it becomes possible obtain white light with high color rendering properties by combining the solid-state light emitting element that emits blue-series laser light and the silicate phosphor with each other.

Herein, in $Lu_3Al_2(AlO_4)_3:Ce^{3+}$ described in Patent Literature 1, the temperature quenching thereof is small, and accordingly, the above-described $Lu_3Al_2(AlO_4)_3:Ce^{3+}$ can maintain high light emission efficiency from a low temperature to a high temperature. In contrast, $Lu_3(Al_{1-x}Ga_x)_2(AlO_4)_3:Ce^{3+}$ as the aluminate phosphor according to this embodiment can increase the temperature quenching as addition amount of gallium increases. Then, as mentioned above, in $Lu_2CaMg_2(SiO_4)_3:Ce^{3+}$ as the silicate phosphor, the temperature quenching thereof is relatively small; however, is still large in comparison with that of $Lu_3Al_2(AlO_4)_3:Ce^{3+}$. Therefore, an amount of gallium, which is added to the aluminate phosphor, is adjusted, thus making it possible to reduce a difference in degree of the temperature quenching between $Lu_2CaMg_2(SiO_4)_3:Ce^{3+}$ and $Lu_3(Al_{1-x}Ga_x)_2(AlO_4)_3:Ce^{3+}$ at the high temperature.

As mentioned above, each of the silicate phosphor and the aluminate phosphor, which are included in the wavelength converter, includes $Ce^{3+}$ as a light emission center. A fluorescence lifetime of $Ce^{3+}$ is $10^{-8}$ to $10^{-7}$ s, and afterglow properties thereof are extremely low in comparison with other light emission centers such as $Eu^{2+}$. Therefore, even under an excitation condition of high-density light such as high-power laser light, a high fluorescence output can be obtained, which has a reduced saturation phenomenon and is substantially proportional to a density of excitation light. Moreover, an emission color of $Ce^{3+}$ changes depending on a base material, and accordingly, it is easy to change a color tone of the output light.

It is preferable that the silicate phosphor and the aluminate phosphor, which are included in the wavelength converter of this embodiment, be powdery. Then, an average particle size of each of the silicate phosphor and the aluminate phosphor is preferably 3 μm or more. Specifically, the silicate phosphor and the aluminate phosphor are preferably particle groups, and the average particle size of each of the silicate phosphor and the aluminate phosphor is preferably 3 μm or more, more preferably 5 μm or more, particularly preferably 10 μm or more. The average particle size of each of the silicate phosphor and the aluminate phosphor is 3 μm or more, whereby each thereof becomes a phosphor easy to use for a light emitting device. Moreover, such silicate phosphor and aluminate phosphor can efficiently absorb short wavelength visible light such as blue light.

In each of the silicate phosphor and the aluminate phosphor, an upper limit of the average particle size is not particularly limited; however, is preferably less than 50 μm, more preferably less than 30 μm in a case of being suitably used as a phosphor for a light emitting device. Note that the average particle size of each of the silicate phosphor and the aluminate phosphor refers to an average value of maximum axial lengths of particles when the particle group of the dispersed phosphor is observed by a microscope. Therefore, when each of the dispersed phosphors is a mixture of primary particles and secondary particles, the average particle size of each of the silicate phosphor and the aluminate phosphor refers to an average value of a sum of maximum axial lengths of the primary particles and maximum axial lengths of the secondary particles.

Next, a method for producing the silicate phosphor and the aluminate phosphor according to this embodiment will be described.

The silicate phosphor can by synthesized by using a conventional solid phase reaction. Specifically, in a case of the silicate phosphor, first, powders of raw materials such as lutetium oxide ($Lu_2O_3$), calcium carbonate ($CaCO_3$), magnesium oxide (MgO), silicon dioxide ($SiO_2$) and cerium oxide ($CeO_2$) are prepared. Next, such raw material powders are blended so as to have a stoichiometric composition of a desired compound or a composition close to the stoichiometric composition, and are mixed thoroughly by using a mortar, a ball mill, a stirrer and the like. A method of the mixing may be either dry mixing or wet mixing. In a case of the wet mixing, ion exchange water, ethanol, isopropyl alcohol, acetone or the like can be used as a medium; however, other mediums may be used, and the medium for use is not limited.

Thereafter, such a mixed raw material is fired by an electric furnace or the like by using a firing vessel such as an alumina crucible, a platinum crucible and a magnetic crucible, whereby a fired product of the mixed raw material can be obtained. Note that, when the mixed raw material is fired, it is preferable to heat the mixed raw material at a firing temperature of 700 to 1000° C. for several hours in the atmosphere or a reducing atmosphere.

Herein, a reaction accelerator may be used at the time of producing the silicate phosphor, and lithium chloride (LiCl) can be used as the reaction accelerator. Moreover, with regard to usage of the reaction accelerator, 2 to 5 moles of the reaction accelerator are preferably used with respect to 1 mol of the phosphor to be synthesized therewith.

Then, the fired product of the mixed raw material, which is obtained as mentioned above, and the reaction accelerator are mixed with each other, and thereafter, are finally fired, whereby the silicate phosphor can be obtained. A method for mixing the fired product of the mixed raw material and the reaction accelerator with each other is not particularly limited, and for example, the mixing may be dry mixing. Moreover, in such final firing, it is preferable to heat the mixed raw materials at a firing temperature of 1100 to 1400° C. for several hours in the reducing atmosphere.

The aluminate phosphor can also be synthesized by using a conventional solid phase reaction like the silicate phosphor. Specifically, in a case of the aluminate phosphor, first, powders of raw materials such as lutetium oxide ($Lu_2O_3$), aluminum oxide ($Al_2O_3$), gallium oxide ($Ga_2O_3$) and cerium oxide ($CeO_2$) are prepared. Next, like the silicate phosphor, such raw material powders are blended so as to have a stoichiometric composition of a desired compound or a composition close to the stoichiometric composition, and are mixed thoroughly by using a mortar, a ball mill, a stirrer and the like.

Thereafter, such a mixed raw material is fired by an electric furnace or the like by using a firing vessel such as an alumina crucible, a platinum crucible and a magnetic crucible, whereby the aluminate phosphor can be obtained. Note that, in the firing, it is preferable to heat the mixed raw materials at a firing temperature of 1400 to 1600° C. for several hours in the atmosphere.

Figure 2:
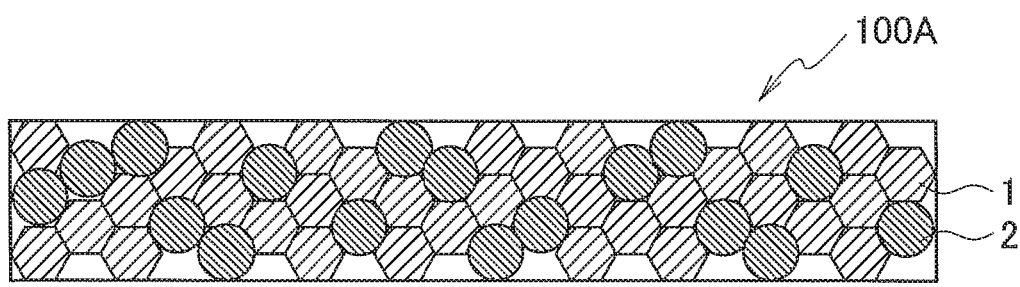
FIG. 2 is a schematic cross-sectional view illustrating another example of the wavelength converter according to the embodiment of the present invention.
Figure 3:
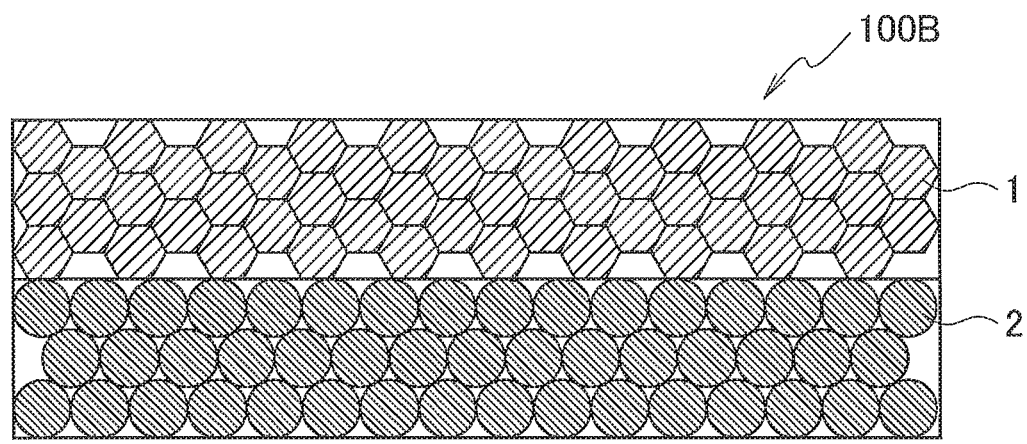
FIG. 3 is a schematic cross-sectional view illustrating still another example of the wavelength converter according to the embodiment of the present invention.

FIG. 1 to FIG. 3 schematically illustrate a cross section of the wavelength converter according to this embodiment. As illustrated in FIG. 1, a wavelength converter 100 according to this embodiment can be configured so that a silicate phosphor 1 and an aluminate phosphor 2 are dispersed inside a sealing body 3. The sealing body 3 is a sealant that seals the phosphor particles, and at least one of an inorganic material and an organic material can be used. As such an inorganic material as described above, for example, there can be mentioned a transparent inorganic material such as low-melting-point glass. Moreover, as such an organic material, for example, a transparent organic material such as a silicone resin can be mentioned. When the inorganic material is used as the sealing body 3, a wavelength converter 100 entirely composed of an inorganic substance can be formed, and accordingly, a wavelength converter excellent in thermal conductivity and advantageous in terms of heat dissipation can be obtained. Meanwhile, when the organic material is used as the sealing body 3, a wavelength converter 100 in which phosphors are dispersed in a resin can be obtained. Such a wavelength converter as described above can be produced easily by a well-known method.

Note that, as illustrated in FIG. 2, the wavelength converter of this embodiment can also be formed as a wavelength converter 100A that does not use the sealing body 3. In this case, particles of the phosphors just need to be adhered to one another by using an organic or inorganic binding agent. Moreover, the particles of the phosphors can also be adhered to one another by using a heating reaction between the silicate phosphor 1 and the aluminate phosphor 2. As the binding agent, there can be used a resin-based adhesive used commonly, or ceramic fine particles, low-melting-point glass or the like. The wavelength converter that does not use the sealing body 3 can be thinned in thickness, and accordingly, suitably used for the light emitting device.

As illustrated in FIG. 3, a wavelength converter 100B of this embodiment can also be configured to have a structure in which a particle group of the silicate phosphor 1 is adhered to a surface of such a plate-shaped aluminate phosphor 2 without using the sealing body 3. In this case, as the plate-shaped aluminate phosphor 2, there can be used a sintered body in which a plurality of phosphor particles are sintered and a plurality of air gaps are provided in an inside. Moreover, as the plate-shaped aluminate phosphor 2, there can be used a ceramic body in which a plurality of phosphor particles are sintered and a plurality of air gaps are not provided in an inside.

In the light emitting device of this embodiment, it is preferable that the wavelength converter consist of inorganic compounds. That is, preferably, all of the silicate phosphor, the aluminate phosphor and the sealing body used according to needs are composed of inorganic compounds, more preferably, all of these are composed of inorganic oxides. Thus, a wavelength converter having good thermal conductivity is formed, and accordingly, it becomes easy to design a light source excellent in heat dissipation. Therefore, the temperature quenching of the phosphors in the wavelength converter is suppressed, and it becomes possible to obtain a light emitting device capable of radiating high output light. Moreover, when the wavelength converter is composed of only the inorganic compounds, not only it becomes easy to handle the wavelength converter in the atmosphere, but also it becomes easy to produce the wavelength converter. Therefore, it becomes possible to form such a wavelength converter suitable for the industrial production.

[Configuration of Light Emitting Device]

A more detailed description will be given of the configuration of the light emitting device according to this embodiment. The light emitting device of this embodiment widely includes electronic devices provided with functions to emit light, and is not particularly limited as long as is an electronic device that emits any kind of light. Moreover, the light emitting device also includes an illumination light source, an illuminator, a display device and the like. Therefore, an illuminator, a projector or the like, which is provided with a laser diode, is also regarded as a light emitting device.

As mentioned above, the light emitting device of this embodiment includes: the solid-state light emitting element; and the wavelength converter that absorbs the laser light emitted by the solid-state light emitting element and performs wavelength conversion of the absorbed laser light into the light with a longer wavelength than that of the laser light. Use of the solid-state light emitting element as the excitation source of the wavelength converter makes it possible to achieve an all-solid-state light emitting device resistant to impact, for example, solid-state illumination.

Figure 4:
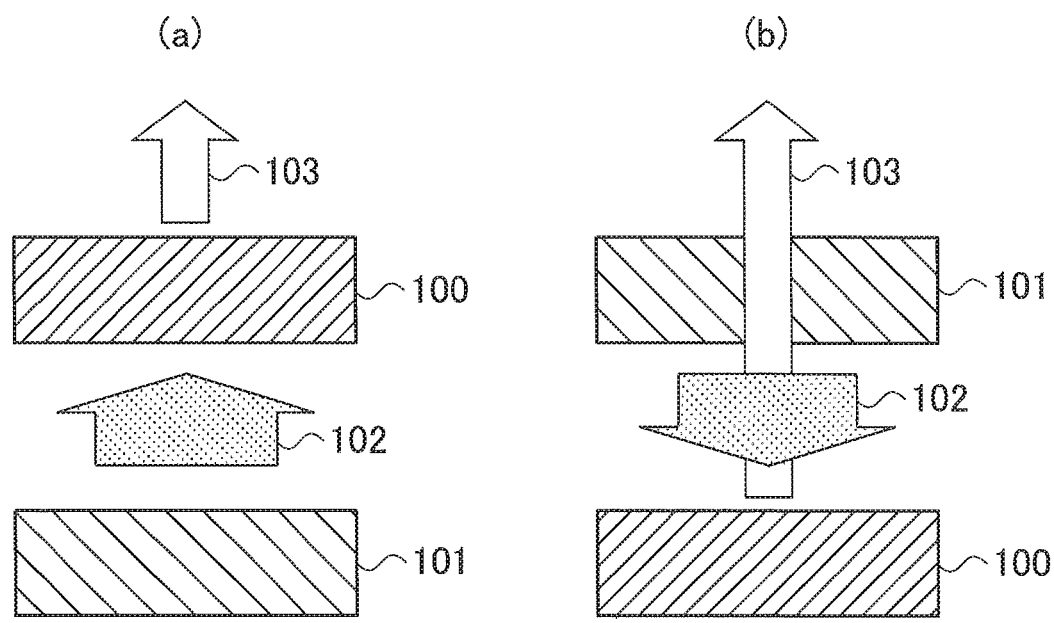
FIG. 4 is schematic views for explaining a light emitting device according to the embodiment of the present invention.

FIG. 4 illustrates an outline of the light emitting device according to this embodiment. In FIG. 4(a) and FIG. 4(b), an excitation source 101 is a light source that generates excitation light 102 for exciting the phosphors provided in the wavelength converter 100 of this embodiment. Then, as the excitation source 101, a solid-state light emitting element that emits laser light is used.

In FIG. 4(a) and FIG. 4(b), output light 103 is light in which the excitation light 102 emitted by the excitation source 101 and fluorescences emitted by the phosphors in the wavelength converter 100, which are excited by the excitation light 102, are subjected to additive color mixture. Then, the output light 103 is used as illumination light or display light in the light emitting device.

FIG. 4(a) illustrates a light emitting device that has a structure in which the output light 103 from the wavelength converter 100 is emitted in a direction where the wavelength converter 100 is irradiated with the excitation light 102. Note that, as the light emitting device illustrated in FIG. 4(a), a fluorescent lamp, an electron tube and the like are mentioned as well as a white light emitting diode light source and a transmission-type laser illuminator. Meanwhile, FIG. 4(b) illustrates a light emitting device that has a structure in which the output light 103 from the wavelength converter 100 is emitted in a reverse direction to the direction where the wavelength converter 100 is irradiated with the excitation light 102. As the light emitting device illustrated in FIG. 4(b), there are mentioned reflection-type laser illuminators, for example, a light source device, a projector and the like, each of which uses a reflective plate-attached phosphor wheel.

Preferable ones as specific examples of the light emitting device are a semiconductor light emitting device, an illumination light source, an illuminator, a display device and the like, each of which uses the phosphors, and particularly, are laser illumination and a laser projector. Then, the light emitting device can be suitably used for any purpose of outdoor illumination, store illumination, a dimming system, facility illumination, ocean illumination, a projector, and an endoscope.

As mentioned above, the light emitting device includes: the solid-state light emitting element that radiates blue light; and the wavelength converter including the silicate phosphor containing $Lu_2CaMg_2(SiO_4)_3:Ce^{3+}$ as a main component and the aluminate phosphor containing $Lu_3(Al_{1-x}Ga_x)(AlO_4)_3:Ce^{3+}$ as a main component. Then, the silicate phosphor can absorb blue light and perform wavelength conversion of the absorbed blue light into orange light, and the aluminate phosphor can absorb blue light and perform wavelength conversion of the absorbed blue light into blue-green to green light. Therefore, in the light emitting device, it becomes possible to radiate high color-rendering white light by the additive color mixture of the blue light radiated by the solid-state light emitting element, the fluorescence (orange light) emitted by the silicate phosphor, and the fluorescence (blue-green to green light) emitted by the aluminate phosphor. That is, it becomes possible to emit light in the white range in an xy chromaticity diagram illustrated in FIG. 5 and illustrated as a reference diagram in Japanese Industrial Standard JIS Z8110.

Herein, the aluminate phosphor can shorten the wavelength of the fluorescence as the addition amount of gallium increases. Therefore, the amount of gallium in the aluminate phosphor is adjusted, whereby fluorescent colors of the silicate phosphor and the aluminate phosphor can be brought close to a complementary relationship. Moreover, as mentioned above, the aluminate phosphor can increase the temperature quenching as the addition amount of gallium increases. Therefore, the amount of gallium in the aluminate phosphor is adjusted, whereby degrees of the temperature quenching caused as the silicate phosphor and the aluminate phosphor get hotter can be made equivalent to each other.

Figure 6:
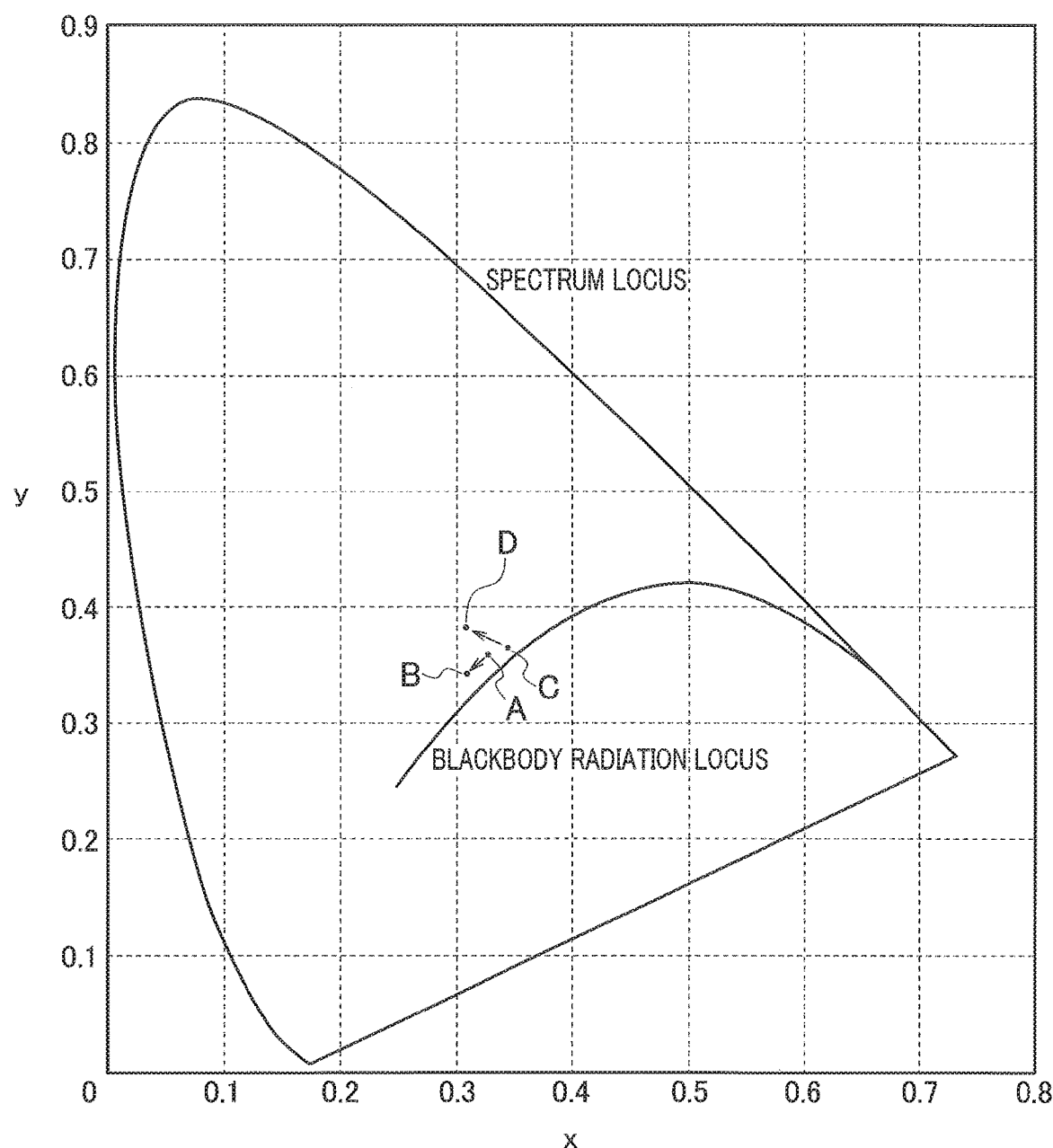
FIG. 6 is a diagram illustrating a spectrum locus and a blackbody radiation locus in the xy chromaticity diagram.

Then, when the degrees of the temperature quenching of the silicate phosphor and the aluminate phosphor are equivalent to each other, then as illustrated in FIG. 6, the color tone of the output light of the light emitting device can be changed from Symbol A to Symbol B. Symbol A is an example of chromaticity coordinates of output light radiated from the light emitting device when the wavelength converter is at a low temperature (for example, 30° C.). Symbol B is an example of chromaticity coordinates of output light radiated from the light emitting device when the wavelength converter is at a high temperature (for example, 150° C.).

Figure 5:
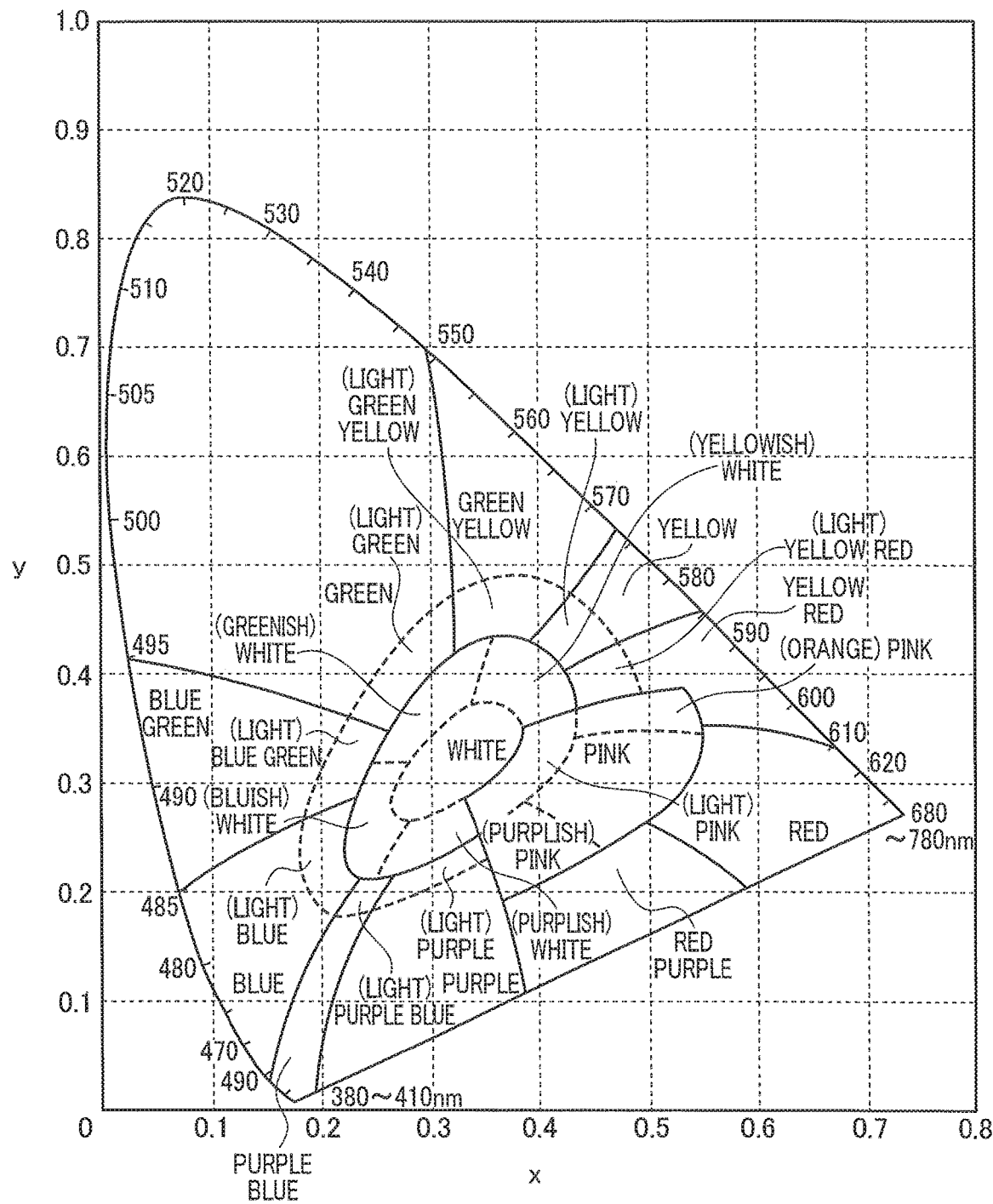
FIG. 5 is an xy chromaticity diagram illustrated as a reference diagram in Japanese Industrial Standard JIS Z8110.

This change of the color tone of the output light occurs in the white range as illustrated in FIG. 5, and the color tone changes in a direction substantially parallel to a blackbody radiation locus. As described above, when such a color tone change occurs in the white range, and changes in the direction substantially parallel to the blackbody radiation locus, it is extremely hard for human eyes to sense the color tone change of the output light. Therefore, even when the wavelength converter is excited by high power, and the temperature of the wavelength converter rises, it becomes possible to cause the human eyes to recognize that the light emitting device continues to radiate high color-rendering white light.

Herein, in $Lu_3Al_2(AlO_4)_3:Ce^{3+}$, which is described in Patent Literature 1 and is an aluminate phosphor that is not added with gallium, temperature quenching thereof is small. Therefore, $Lu_3Al_2(AlO_4)_3:Ce^{3+}$ can maintain high light emission efficiency from a low temperature to a high temperature. However, in $Lu_2CaMg_2(SiO_4)_3:Ce^{3+}$ as the silicate phosphor, the temperature quenching thereof is relatively small; however, is still large in comparison with that of $Lu_3Al_2(AlO_4)_3:Ce^{3+}$. Therefore, when $Lu_3Al_2(AlO_4)_3:Ce^{3+}$ and $Lu_2CaMg_2(SiO_4)_3:Ce^{3+}$ are used as the phosphors of the wavelength converter, a large difference is generated between the degrees of the temperature quenching that occurs as the silicate phosphor and the aluminate phosphor get hotter.

Then, when there is a large difference between the degrees of the temperature quenching of the silicate phosphor and the aluminate phosphor, then as illustrated in FIG. 6, the color tone of the output light of the light emitting device changes from Symbol C to Symbol D. Symbol C is an example of chromaticity coordinates of output light radiated from the light emitting device when the wavelength converter composed of the silicate phosphor and the aluminate phosphor is at a low temperature (for example, 30° C.). Symbol D is an example of chromaticity coordinates of output light radiated from the light emitting device when the wavelength converter is at a high temperature (for example, 150° C.).

This change of the color tone of the output light occurs from the white range toward the greenish white range as illustrated in FIG. 5, and the color tone changes in a direction approximately vertical to the blackbody radiation locus. As described above, when such a color tone change occurs from the white range toward the greenish white range, and the color tone changes in the direction approximately vertical to the blackbody radiation locus, the human eyes can easily sense the color tone change of the output light. That is, sensitivity of the human eyes for wavelengths of light, includes not only sense of colors but also sense of brightness, and differs depending on the wavelengths. Even if yellow and green light and red and blue light are light having the same energy, the yellow and green light looks bright, and meanwhile, the red and blue light looks dark. Then, the maximum wavelength of the standard luminosity function in a photopic state is 555 nm, and the human eyes have high sensitivity for the green light. Therefore, when the color tone changes from the white range to the green range, such a color tone change is easily sensed. Hence, when the wavelength converter using $Lu_3Al_2(AlO_4)_3:Ce^{3+}$ and $Lu_2CaMg_2(SiO_4)_3:Ce^{3+}$ is excited by high power, and the temperature of the wavelength converter rises, it is easily recognized that the color tone of the output light changes.

In contrast, as mentioned above, in the light emitting device of this embodiment, this change of the color tone of the output light occurs in the white range, and the color tone changes in the direction substantially parallel to the blackbody radiation locus. Therefore, even when the temperature of the wavelength converter rises, it becomes possible to cause the human eyes to recognize that the light emitting device continues to radiate the high color-rendering white light.

As described above, the light emitting device of this embodiment includes: the solid-state light emitting element that radiates the blue-series laser light; and the wavelength converter that absorbs the laser light and performs wavelength conversion of the absorbed laser light into the light with a longer wavelength than that of the laser light. Then, the wavelength converter includes: the silicate phosphor containing $Lu_2CaMg_2(SiO_4)_3:Ce^{3+}$ as a main component; and the aluminate phosphor containing $Lu_3(Al_{1-x}Ga_x)_2(Al_4)_3:Ce^{3+}$ (where x is a numeric value that satisfies $0<x\leq1$) as a main component. With such a configuration, it becomes possible to radiate the high color-rendering white light by the additive color mixture of the orange light component of the silicate phosphor, the blue-green light component of the aluminate phosphor substantially complementary to the orange light component, and the blue light component of the laser light. Moreover, when the temperature of the wavelength converter rises due to high-power excitation, the color tone of the output light does not change to the direction substantially vertical to the blackbody radiation locus, but changes to the direction substantially parallel to the blackbody radiation locus. Therefore, it becomes possible to obtain a light emitting device in which such a color tone change is hard to see for the human eyes.

Moreover, in order to obtain high light emission efficiency even at the time of a high temperature, the conventional light emitting device has tended to use a phosphor with small temperature quenching for the wavelength converter. However, in the light emitting device of this embodiment, the temperature quenching of the aluminate phosphor is intentionally increased, and the degrees of the temperature quenching of the silicate phosphor and the aluminate phosphor are made equivalent to each other. Thus, even when the temperature of the wavelength converter rises, it is made possible to cause the human eyes to recognize that the light emitting device continues to radiate the high color-rendering white light.

Note that, in $Lu_3(Al_{1-x}Ga_x)_2(AlO_4)_3$:$Ce^{3+}$ in the aluminate phosphor, x is preferably a numeric value that satisfies $0.3 \leq x \leq 1$, more preferably a numeric value that satisfies $0.5 \leq x \leq 1$. Thus, it becomes possible to made the degrees of the temperature quenching of the silicate phosphor and the aluminate phosphor equivalent to each other, and to make the color tone change of the light emitting device harder to sense.

In the light emitting device of this embodiment, a difference between an internal quantum efficiency maintenance factor of the silicate phosphor at 150° C. and an internal quantum efficiency maintenance factor of the aluminate phosphor at 150° C. is preferably 10% or less. Further, the difference between the internal quantum efficiency maintenance factors is more preferably 5% or less. "Internal quantum efficiency maintenance factor at 150° C." refers to an internal quantum efficiency measured at 150° C. in the case where an internal quantum efficiency measured at 30° C. is defined as 100%. Therefore, in the case where the internal quantum efficiency measured at 30° C. is defined as 100%, the internal quantum efficiency maintenance factor is 80% when the internal quantum efficiency measured at 150° C. is 80%.

The difference in internal quantum efficiency maintenance factor between the silicate phosphor and the aluminate phosphor at 150° C. is 10% or less, whereby the degrees of the temperature quenching of the silicate phosphor and the aluminate phosphor can be made equivalent to each other. Therefore, even when the temperature of the wavelength converter rises due to high-power excitation, the color tone of the output light does not change to the direction substantially vertical to the blackbody radiation locus, but changes to the direction substantially parallel to the blackbody radiation locus. Therefore, this change becomes hard to see for the human eyes, and it becomes possible to cause the human eyes to recognize that the light emitting device continues to radiate the high color-rendering white light.

It is preferable that the light emitting device radiate output light with an average color rendering index Ra of 80 or more and less than 98. When the average color rendering index Ra of the output light of the light emitting device stays within the above-described range, such a light emitting device that radiates light that has high color rendering properties and is preferred as illumination light is obtained. As a method for setting the average color rendering index Ra of the output light of the light emitting device within the above-described range, there is used a method of selecting laser light different in wavelength range, or a method of adjusting amounts of the silicate phosphor and the aluminate phosphor, which are included in the wavelength converter.

Moreover, preferably, the light emitting device radiates output light with a correlated color temperature (Tc) of 2500 K or more and less than 8000 K. Further, more preferably, the light emitting device radiates output light with a correlated color temperature (Tc) of 2700 K or more and less than 5500 K, still more preferably, the light emitting device radiates output light with a correlated color temperature (Tc) of 3000 K or more and less than 4000 K. When the correlated color temperature of the output light of the light emitting device stays within the above-described range, such a light emitting device that radiates light preferred as illumination light is obtained. As a method for setting the correlated color temperature of the output light of the light emitting device within the above-described range, there is used such a method of selecting laser light different in wavelength range, or such a method of adjusting amounts of the silicate phosphor and the aluminate phosphor, which are included in the wavelength converter.

The light emitting device of this embodiment uses the phosphors, which are activated by $Ce^{3+}$ having ultrashort afterglow properties and stable even in the atmosphere, as the phosphors for use in the wavelength converter. Therefore, the light emission of the light emitting device is hard to saturate even under the high-density photoexcitation by irradiation of the laser light, and the light emitting device has high output and high long-term reliability. Therefore, it is preferable that the light emitting device of this embodiment be a laser illuminator.

EXAMPLES

Hereinafter, this embodiment will be described more in detail by Examples and Comparative example; however, this embodiment is not limited to the examples.

[Preparation of Phosphor]

A silicate phosphor and an aluminate phosphor, which were used in Examples and Comparative example, were synthesized by using a preparation method that utilizes a solid phase reaction. Note that the following compound powders were used as main raw materials at the time of synthesizing the silicate phosphor and the aluminate phosphor.

Lutetium oxide ($Lu_2O_3$): purity 3N, made by Shin-Etsu Chemical Co, Ltd.

Calcium carbonate ($CaCO_3$): purity 2N5, made by Kanto Chemical Co., Inc.

Magnesium oxide (MgO): purity 3N, made by Wako Pure Chemical Industries, Ltd.

Silicon dioxide ($SiO_2$): purity>3N, made by Nippon Aerosil Co., Ltd.

Aluminum oxide ($\theta$-$Al_2O_3$): purity 4N5, AKP-G008 made by Sumitomo Chemical Co., Ltd.

Gallium oxide ($Ga_2O_3$): purity 4N, Wako Pure Chemical Industries, Ltd.

Moreover, at the time of synthesizing the silicate phosphor, the following compound powder was used as a reaction accelerator (flux).

Lithium chloride (LiCl): purity 2N, made by Wako Pure Chemical Industries, Ltd.

Synthesis of $(Lu_{0.99}Ce_{0.01})_2CaMg_2(SiO_4)_3$

First, lutetium oxide, cerium oxide, calcium carbonate, magnesium oxide and silicon dioxide were weighed so as to have a stoichiometric composition of $(Lu_{0.99}Ce_{0.01})_2CaMg_2(SiO_4)_3$. Next, these raw materials were subjected to dry mixing by using a mortar and a pestle, and a phosphor raw material was obtained. Then, after the reaction accelerator was added to the phosphor raw material, a resultant was subjected to dry mixing by using a mortar and a pestle. Note that a mixture ratio of the reaction accelerator with respect to the phosphor raw material was adjusted so that an amount of LiCl became 3 moles with respect to 1 mol of $(Lu_{0.99}Ce_{0.01})_2CaMg_2(SiO_4)_3$.

By using a tubular atmosphere furnace, the mixed powder thus prepared was fired for 1 hour in a reducing atmosphere (atmosphere composed of 96 vol % of nitrogen and 4 vol % of hydrogen) at 1350° C. Both of a heating rate and a cooling rate were set to 400° C./hour. Thereafter, a fired product thus obtained was disintegrated by using an alumina mortar and an alumina pestle. Thus, $(Lu_{0.99}Ce_{0.01})_2CaMg_2(SiO_4)_3$ was obtained.

Note that the fact that a sample after the firing was $(Lu_{0.99}Ce_{0.01})_2CaMg_2(SiO_4)_3$ was confirmed by an X-ray diffraction method.

Synthesis of $(Lu_{0.99}Ce_{0.01})_3Al_2(AlO_4)_3$, $(Lu_{0.99}Ce_{0.01})_3(Al_{0.7}Ga_{0.3})_2(AlO_4)_3$ and $(Lu_{0.99}Ce_{0.01})_3Ga_2(AlO_4)_3$ First, lutetium oxide ($Lu_2O_3$), cerium oxide ($CeO_2$), aluminum oxide ($Al_2O_3$) and gallium oxide ($Ga_2O_3$) were weighed so as to have the stoichiometric compositions of the respective phosphors. Next, these raw materials were subjected to dry mixing by using a mortar and a pestle, and a phosphor raw material was obtained.

The mixed powder thus prepared was fired at 1550° C. for 2 hours by using an atmosphere furnace. Both of a heating rate and a cooling rate were set to 400° C./hour. Thereafter, a fired product thus obtained was disintegrated by using an alumina mortar and an alumina pestle. Thus, $(Lu_{0.99}Ce_{0.01})_3Al_2(AlO_4)_3$, $(Lu_{0.99}Ce_{0.01})_3(Al_{0.7}Ga_{0.3})_2(AlO_4)_3$ and $(Lu_{0.99}Ce_{0.01})_3Ga_2(AlO_4)_3$ were synthesized. Note that the reaction accelerator (flux) was not used at the time of synthesizing these phosphors.

Note that the fact that samples after the firing were $(Lu_{0.99}Ce_{0.01})_3Al_2(AlO_4)_3$, $(Lu_{0.99}Ce_{0.01})_3(Al_{0.7}Ga_{0.3})_2(AlO_4)_3$ and $(Lu_{0.99}Ce_{0.01})_3Ga_2(AlO_4)_3$ was confirmed by an X-ray diffraction method.

Then, in Example 1, $(Lu_{0.99}Ce_{0.01})_2CaMg_2(SiO_4)_3$ and $(Lu_{0.99}Ce_{0.01})_3(Al_{0.7}Ga_{0.3})_2(AlO_4)_3$ were combined with each other to form a wavelength converter. Then, in Example 2, $(Lu_{0.99}Ce_{0.01})_2CaMg_2(SiO_4)_3$ and $(Lu_{0.99}Ce_{0.01})_3Ga_2(AlO_4)_3$ were combined with each other to form a wavelength converter. In Comparative example, $(Lu_{0.99}Ce_{0.01})_2CaMg_2(SiO_4)_3$ and $(Lu_{0.99}Ce_{0.01})_3Al_2(AlO_4)_3$ were combined with each other to form a wavelength converter.

[Evaluation]
(Evaluation of Internal Quantum Efficiency)

Internal quantum efficiencies of the silicate phosphor $((Lu_{0.99}Ce_{0.01})_2CaMg_2(SiO_4)_3)$ and the aluminate phosphors $((Lu_{0.99}Ce_{0.01})_3Al_2(AlO_4)_3$, $(Lu_{0.99}Ce_{0.01})_3(Al_{0.7}Ga_{0.3})_2(AlO_4)_3$ and $(Lu_{0.99}Ce_{0.01})_3Ga_2(AlO_4)_3)$, which were obtained as mentioned above, were individually measured. The internal quantum efficiencies in these phosphors were measured by using the quantum efficiency measuring system QE-1100 made by Otsuka Electronics Co., Ltd. Measurement and analysis conditions are as follows.

Excitation wavelength: 450 nm
Number of integrations: 30 times
Exposure time: automatic
Measurement temperature range: 30° C. to 150° C.
Measurement temperature step: 10° C.
Excitation light wavelength range: 20 nm
Fluorescence wavelength range: 370 nm to 800 nm Then, with regard to the silicate phosphor and the aluminate phosphors, internal quantum efficiencies thereof at 150° C. in the case where internal quantum efficiencies thereof at 30° C. were defined as 100% were obtained as internal quantum efficiency maintenance factors. The phosphors used in Examples 1 and 2 and Comparative example and the internal quantum efficiency maintenance factors of the respective phosphors are collectively shown in Table 1. Note that each of the internal quantum efficiency maintenance factors is a scale of the temperature quenching, and a lower internal quantum efficiency maintenance factor at the time of the temperature rise indicates larger temperature quenching.

Moreover, Table 1 also shows fluorescence peak wavelengths of the phosphors used in Examples 1 and 2 and Comparative example, the fluorescence peak wavelengths having also been measured at the time of evaluating the internal quantum efficiencies.

TABLE 1

| | Phosphor | Internal quantum efficiency maintenance factor (%) | | Flouresence peak wavelength (nm) |
|---|---|---|---|---|
| | | 30° C. | 150° C. | |
| Example 1 | $(Lu_{0.99}Ce_{0.01})_2CaMg_2(SiO_4)_3$ | 100 | 84 | 594 |
| | $(Lu_{0.99}Ce_{0.01})_3 (Al_{0.7}Ga_{0.3})_2(AlO_4)_3$ | 100 | 89 | 505 |
| Example 2 | $(Lu_{0.99}Ce_{0.01})_2CaMg_2(SiO_4)_3$ | 100 | 84 | 594 |
| | $(Lu_{0.99}Ce_{0.01})_3Ga_2(AlO_4)_3$ | 100 | 82 | 500 |
| Comparative example | $(Lu_{0.99}Ce_{0.01})_2CaMg_2(SiO_4)_3$ | 100 | 84 | 594 |
| | $(Lu_{0.99}Ce_{0.01})_3Al_2(AlO_4)_3$ | 100 | 99 | 506 |

As shown in Table 1, in $(Lu_{0.99}Ce_{0.01})_2CaMg_2(SiO_4)_3$ and $(Lu_{0.99}Ce_{0.01})_3(Al_{0.7}Ga_{0.3})_2(AlO_4)_3$, which were used in Example 1, the internal quantum efficiency maintenance factors were respectively 84% and 89%. Therefore, a difference between the internal quantum efficiency maintenance factors in these phosphors is 5%. In $(Lu_{0.99}Ce_{0.01})_2CaMg_2(SiO_4)_3$ and $(Lu_{0.99}Ce_{0.01})_3Ga_2(Al_4)_3$, which were used in Example 2, the internal quantum efficiency maintenance factors were respectively 84% and 82%. Therefore, a difference between the internal quantum efficiency maintenance factors in these phosphors is 2%. As described above, it is seen that the difference in temperature quenching between the silicate phosphor and the aluminate phosphor in each of Examples is relatively small. Note that the fact that $Lu_3(Al_{1-x}Ga)_2(AlO_4)_3:Ce^{3+}$ exhibits such fluorescence properties as shown in Table 1 has not heretofore been known, and is first revealed by this experiment.

In contrast, in $(Lu_{0.99}Ce_{0.01})_2CaMg_2(SiO_4)_3$ and $(Lu_{0.99}Ce_{0.01})_3Al_2(AlO_4)_3$, which were used in Comparative example, the internal quantum efficiency maintenance factors were respectively 84% and 99%. Therefore, a difference between the internal quantum efficiency maintenance factors in these phosphors is 15%. As described above, it is seen that the difference in temperature quenching between the silicate phosphor and the aluminate phosphor in Comparative example is relatively large.

(Evaluation of Output Light)

First, light emission spectra of the silicate phosphor $((Lu_{0.99}Ce_{0.01})_2CaMg_2(SiO_4)_3)$ and the aluminate phosphors $((Lu_{0.99}Ce_{0.01})_3Al_2(AlO_4)_3$ and $(Lu_{0.99}Ce_{0.01})_3(Al_{0.7}Ga_{0.3})_2(AlO_4)_3$ and $(Lu_{0.99}Ce_{0.01})_3Ga_2(AlO_4)_3)$, which were obtained as mentioned above, were measured. The light emission spectra were measured by using a quantum efficiency measuring system (product name: QE-1100 made by Otsuka Electronics Co., Ltd.). Note that an excitation peak wavelength at the time of measuring the light emission spectra was set to 450 nm. Moreover, the respective light emission spectra of the silicate phosphor and the aluminate phosphors were measured at 30° C. and 150° C.

Next, by using the light emission spectra of the respective phosphors, which were obtained as mentioned above, spectral distributions of the output light radiated by the light emitting devices in the respective examples were created by a simulation. Note that the simulation was performed by using the light emission spectra of the respective phosphors, which were measured at 30° C. and 150° C., and both of spectral distributions of the output light radiated at 30° C. and spectral distributions of the output light radiated at 150° C. were created.

That is, the spectral distribution of the output light according to Example 1 was obtained by adding the respective spectral distributions of the blue laser diode, $(Lu_{0.99}Ce_{0.01})_2CaMg_2(SiO_4)_3$ and $(Lu_{0.99}Ce_{0.01})_3(Al_{0.7}Ga_{0.3})_2(AlO_4)_3$ to each other. The spectral distribution of the output light according to Example 2 was obtained by adding the respective spectral distributions of the blue laser diode, $(Lu_{0.99}Ce_{0.01})_2CaMg_2(SiO_4)_3$ and $(Lu_{0.99}Ce_{0.01})_3Ga_2(AlO_4)_3$ to each other. Moreover, the spectral distribution of the output light according to Comparative example 1 was obtained by adding the respective spectral distributions of the blue laser diode, $(Lu_{0.99}Ce_{0.01})_2CaMg_2(SiO_4)_3$ and $(Lu_{0.99}Ce_{0.01})_3Al_2(AlO_4)_3$ to each other. Note that a peak wavelength of the blue laser diode was 450 nm.

Then, from the spectral distributions obtained by the simulation, average color rendering indices Ra and correlated color temperatures at 30° C. and 150° C. in the light emitting devices in Examples 1 and 2 and Comparative example were obtained. The obtained average color rendering indices Ra and correlated color temperatures are shown in Table 2.

TABLE 2

|  | Average color rendering index Ra | | Correlated color temperature | |
| --- | --- | --- | --- | --- |
|  | 30° C. | 150° C. | 30° C. | 150° C. |
| Example 1 | 79 | 80 | 5043 | 5422 |
| Example 2 | 85 | 86 | 5565 | 6006 |
| Comparative example | 77 | 77 | 4845 | 5237 |

As shown in Table 2, in the light emitting device of Example 1, the average color rendering indices Ra at both of 30° C. and 150° C. are approximately 80, and it is seen that high color-rendering white light is obtained therefrom.

Moreover, in the light emitting device of Example 2, the average color rendering indices Ra at both of 30° C. and 150° C. exceed 85, and it is seen that high color-rendering white light is obtained therefrom even at a high temperature.

However, in the light emitting device of Comparative example, the average color rendering indices Ra at both of 30° C. and 150° C. are 77, and the color rendering properties decrease in comparison with Examples. As mentioned above, $Lu_2CaMg_2(SiO_4)_3:Ce^{3+}$ is an orange phosphor, in which an amount of a red component included in light radiated therefrom is small. Moreover, $Lu_3Al_2(AlO_4)_3:Ce^{3+}$ is a green phosphor, in which an amount of a blue-green component included in light radiated therefrom is small. Therefore, as in Comparative example, in output light of a light emitting device in which the blue laser diode and the wavelength converter including $Lu_3Al_2(AlO_4)_3:Ce^{3+}$ and $Lu_2CaMg_2(SiO_4)_3:Ce^{3+}$ are combined with each other, color rendering properties thereof decrease.

In contrast, in $Lu(Al_{1-x}Ga_x)_2(AlO_4)_3:Ce^{3+}$ of each of Examples, a light emission wavelength thereof shifts to a shorter wavelength side than that of $Lu_3Al_2(AlO_4)_3:Ce^{3+}$. Therefore, the blue-green light component emitted by $Lu_3(Al_{1-x}Ga_x)_2(AlO_4)_3:Ce^{3+}$ becomes complementary to the orange light component emitted by $Lu_2CaMg_2(SiO_4)_3:Ce^{31}$. As a result, output light of a light emitting device in which the blue laser diode and the wavelength converter including $Lu_3(Al_{1-x}Ga_x)_2(AlO_4)_3:Ce^{3+}$ and $Lu_2CaMg_2(SiO_4)_3:Ce^{3+}$ are combined with each other becomes capable of enhancing color rendering properties thereof.

Figure 7:
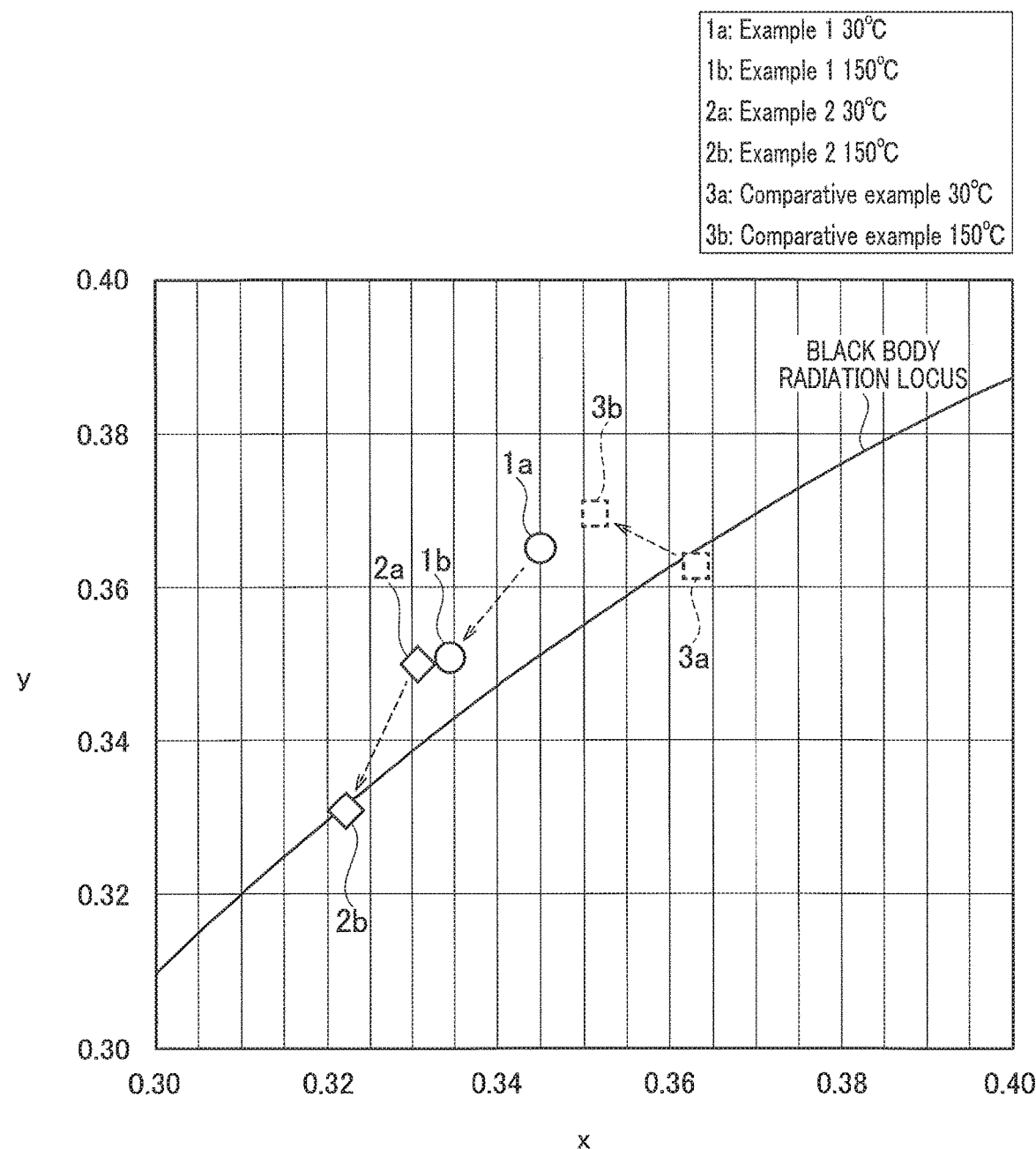
FIG. 7 is a diagram showing chromaticity coordinates x and y in cases of 30° C. and 150° C. in light emitting devices of Examples 1 and 2 and Comparative example.

Then, from the spectral distributions obtained by the simulation, chromaticity coordinates x, y at 30° C. and 150° C. in the light emitting devices of Examples 1 and 2 and Comparative example were obtained. The chromaticity coordinates x, y at 30° C. and 150° C. in the respective examples are shown in FIG. 7. Moreover, in FIG. 7, a blackbody radiation locus is also shown in combination.

As shown in FIG. 7, it is seen that, in the light emitting devices of Examples 1 and 2, even when the temperature of each of the wavelength converters rises from 30° C. to 150° C., the color tone thereof changes in the direction substantially parallel to the blackbody radiation locus. Then, when FIG. 5 and FIG. 7 are compared with each other, it is seen that the color tones of Examples 1 and 2 change in the white range. Therefore, even when the color tone changes due to the temperature rise, this color tone change becomes hard for the human eyes to see. Hence, it is seen that, even if the temperature of the wavelength converter rises, such a light emitting device capable of obtaining the high color-rendering white light is formed.

In contrast to this, as shown in FIG. 7, it is seen that, when the temperature of the light emitting device of Comparative example rises from 30° C. to 150° C., the color tone changes in the direction substantially vertical to the blackbody radiation locus. That is, when FIG. 5 and FIG. 7 are compared with each other, as the temperature of the wavelength converter in the light emitting device of Comparative example rises, the color tone changes from the white color range to the greenish white range. Then, as mentioned above, the human eyes have high sensitivity to the green light. Therefore, when the color tone moves from the white range to the greenish white range, such a color tone change is easily sensed.

As described above, the light emitting device in each of Examples becomes a light emitting device that, when the temperature rises, causes a color shift in the direction parallel to the blackbody radiation locus, and makes the color tone change of the output light hard to see for the human eyes. In contrast, the light emitting device in Comparative example becomes a light emitting device that, when the temperature rises, causes a color shift in the direction substantially vertical to the blackbody radiation locus, and makes the color tone change of the output light easy to see for the human eyes. Therefore, it is seen that combination use of the phosphor made of $Lu_2CaMg_2(SiO_4)_3:Ce^{3+}$ and the phosphor made of $Lu_3(Al_{1-x}Ga_x)_2(AlO_4)_3:Ce^{3+}$ makes it possible to obtain such a light emitting device with high color rendering properties, in which the color tone change at the time of the temperature rise is hard to see.

Although this embodiment has been described above by Example and Comparative example, this embodiment is not limited to these, and various modifications are possible within the scope of the spirit of this embodiment.

The entire contents of Japanese Patent Application No. 2017-142539 (filed on: Jul. 24, 2017) are incorporated herein by reference.

INDUSTRIAL APPLICABILITY

In accordance with the present invention, there can be provided the light emitting device in which the color tone change of the white light at the time of the temperature rise is hard for the human eyes to see, the light emitting device being capable of radiating the high color-rendering output light.

REFERENCE SIGNS LIST

1 Silicate phosphor
2 Aluminate phosphor
100, 100A, 100B Wavelength converter

The invention claimed is:

1. A light emitting device comprising:
   a solid-state light emitting element that radiates blue-series laser light; and
   a wavelength converter that absorbs the laser light and performs wavelength conversion of the absorbed laser light into light with a longer wavelength than a wavelength of the laser light,
   wherein the wavelength converter includes:
      a silicate phosphor containing $Lu_2CaMg_2(SiO_4)_3:Ce^{3+}$ as a main component; and
      an aluminate phosphor containing $Lu_3(Al_{1-x}Ga_x)_2(AlO_4)_3:Ce^{3+}$ as a main component, where x is a numeric value that satisfies $0<x\leq1$.

2. The light emitting device according to claim 1, wherein the silicate phosphor is a phosphor that emits light having a fluorescence peak within a wavelength range of 580 nm or more and less than 630 nm.

3. The light emitting device according to claim 1, wherein the aluminate phosphor is a phosphor that emits light having a fluorescence peak within a wavelength range of 490 nm or more and less than 530 nm.

4. The light emitting device according to claim 1, wherein a difference between an internal quantum efficiency maintenance factor of the silicate phosphor at 150° C. and an internal quantum efficiency maintenance factor of the aluminate phosphor at 150° C. is 10% or less.

5. The light emitting device according to claim 1, wherein the wavelength converter consists of inorganic compounds.

6. The light emitting device according to claim 1, wherein the light emitting device radiates output light in which an average color rendering index Ra is 80 or more and less than 98.

7. The light emitting device according to claim 1, wherein the light emitting device radiates output light in which a correlated color temperature is 2500 K or more and less than 8000 K.

8. The light emitting device according to claim 1, wherein the light emitting device is a laser illuminator.

9. The light emitting device according to claim 1, wherein the wavelength converter includes:
   the silicate phosphor being $Lu_2CaMg_2(SiO_4)_3:Ce^{3+}$; and
   the aluminate phosphor being $Lu_3(Al_{1-x}Ga_x)_2(AlO_4)_3:Ce^{3+}$ as the main component, where x is a numeric value that satisfies $0<x\leq1$.

10. The light emitting device according to claim 1, wherein, in $Lu_3(Al_{1-x}Ga_x)_2(AlO_4)_3:Ce^{3+}$ in the aluminate phosphor, x is a numeric value that satisfies $0.3\leq x\leq1$.

11. The light emitting device according to claim 1, wherein, in $Lu_3(Al_{1-x}Ga_x)_2(AlO_4)_3:Ce^{3+}$ in the aluminate phosphor, x is a numeric value that satisfies $0.5\leq x\leq1$.

12. The light emitting device according to claim 9, wherein, in $Lu_3(Al_{1-x}Ga_x)_2(AlO_4)_3:Ce^{3+}$ in the aluminate phosphor, x is a numeric value that satisfies $0.3\leq x\leq1$.

13. The light emitting device according to claim 9, wherein, in $Lu_3(Al_{1-x}Ga_x)_2(AlO_4)_3:Ce^{3+}$ in the aluminate phosphor, x is a numeric value that satisfies $0.5\leq x\leq1$.

14. The light emitting device according to claim 1, wherein, in the silicate phosphor, an ion which functions as a light emission center is only $Ce^{3+}$.

* * * * *